(12) United States Patent
Yang

(10) Patent No.: US 6,193,796 B1
(45) Date of Patent: Feb. 27, 2001

(54) METHOD OF CRYSTALLIZING SILICON LAYER

(75) Inventor: Myoung-Su Yang, Anyang (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/212,506

(22) Filed: Dec. 15, 1998

(30) Foreign Application Priority Data

Jan. 24, 1998 (KR) .................................................... 98-2239

(51) Int. Cl.$^7$ ........................................................ C30B 1/02
(52) U.S. Cl. .................................................. 117/4; 117/904
(58) Field of Search ................................. 117/904, 3, 4, 117/37

(56) References Cited

U.S. PATENT DOCUMENTS

| | | | |
|---|---|---|---|
| 4,059,461 | * 11/1977 | Fan et al. ............................. | 148/1.5 |
| 4,309,225 | * 1/1982 | Fan et al. ............................. | 148/1.5 |
| 4,341,569 | * 7/1982 | Yaron et al. ......................... | 148/1.5 |
| 4,584,860 | 4/1986 | Leonard ................................ | 72/61 |
| 4,769,346 | 9/1988 | Gadkaree et al. .................... | 501/9 |
| 4,901,552 | 2/1990 | Ginty et al. .......................... | 72/60 |
| 5,366,926 | * 11/1994 | Mei et al. ............................. | 437/173 |
| 5,467,626 | 11/1995 | Sanders ................................. | 72/60 |
| 5,530,227 | 6/1996 | Matsen et al. ....................... | 219/633 |
| 5,582,215 | 12/1996 | Yamamoto et al. ................. | 140/105 |
| 5,683,608 | 11/1997 | Matsen et al. ....................... | 219/676 |
| 5,821,135 | * 10/1998 | Mei et al. ............................. | 438/57 |

* cited by examiner

Primary Examiner—Benjamin L. Utech
Assistant Examiner—Matthew Anderson
(74) Attorney, Agent, or Firm—Long Aldridge & Norman LLP

(57) ABSTRACT

A method of crystallizing an amorphous silicon layer to form a polycrystalline silicon layer having uniform and large grain sizes using an improved laser beam profile despite a reduced overlapping ratio. The polycrystalline layer is formed by melting the amorphous silicon layer completely, forming a polycrystalline silicon layer having fine grains by crystallizing the melted silicon layer, re-melting the fine grains in the polycrystalline silicon layer except a portion of the layer at a lower interface thereof, and re-crystallizing the silicon layer including the unmelted portion.

18 Claims, 3 Drawing Sheets

METHOD OF CRYSTALLIZING SILICON LAYER

BACKGROUND OF THE INVENTION

1. Field of the Invention

The present invention relates to a method of crystallizing a silicon layer to form a uniform layer of polycrystalline silicon having large grain sizes by improving the beam profile of the laser used for crystallization despite a reduced overlapping ratio.

2. Discussion of the Related Art

FIG. 1 is a graph representing grain sizes versus the energy density of an excimer laser when an amorphous silicon layer is irradiated with a single pulse from the excimer laser. Referring to FIG. 1, in an energy level region I, although the laser energy level increases, the grain size increases slowly. In an energy level region II, the grain size increases sharply with the laser energy. When the laser energy density increases pass a level 11 into an energy level region III, the grain size decreases abruptly with the further increase of laser energy. Thus, when a laser beam is applied to an amorphous silicon layer to form polycrystalline silicon, the grain size of the polycrystalline silicon depends on the density of the laser beam to a great extent.

In the energy level region I, a portion of the amorphous silicon layer near the lower surface thereof (a lower interface) never melts since the laser energy density is low. In this case, grains start to grow as solidification proceeds from micro-crystal seeds present in the unmelted portion of the silicon layer to an upper, melted part of the silicon layer. As grains grow in a vertical direction, the grain sizes are small and depend less on the variation of the laser energy density.

In the energy level region II, most of the amorphous silicon near the lower interface is melted, but some parts of the silicon near the lower interface still remain unmelted. In this case, lateral crystal growth precedes from seeds present in the unmelted silicon portion to the melted silicon portion. Thus, the grain size increases rapidly with the laser energy density. The grain size is inversely proportional to the density of the seeds. As a result, the grain sizes formed using a laser in the energy level region II are more than ten times greater than those in the region I.

As shown in FIG. 1, the variations of the grain sizes are extremely large depending on the laser energy density, which means that the process window (the range of suitable laser energy levels) is very narrow since a small variation in laser energy density results in a large variation of the grain size. Hence, when laser crystallization proceeds in region II, it is difficult to maintain the accuracy of the equipment to accommodate the narrow process window, and mass-production is also difficult due to low yield.

In the energy level region III, there is no grain remaining at the lower interface as the amorphous silicon layer is completely melted. In this case, during the process of solidifying the melted silicon, nuclei occur and grow in many localities. Thus, minute grains are formed.

In general, as shown in FIG. 2, laser crystallization of a silicon layer is carried out by scanning a pulse laser beam 25 across a dehydrogenated amorphous silicon layer 23. The laser beam has a spacial profile of a Gaussian shape or a flat peak, and the successive laser pulses spatially overlap on the silicon layer.

FIG. 3 shows a prior art profile of a laser beam used for laser annealing of an amorphous silicon layer. Referring to FIG. 3, the laser beam profile has a flat peak region 32. When the laser beam is scanned from left to right in an overlapping manner over the silicon layer, the portion 31 of the profile to the left of the flat peak region 32 is a trailing region (or energy density decreasing region) and the portion 33 of the profile to the right of the flat peak region 32 is a leading region (or energy density increasing region). The dotted line 34 represents the laser energy level which fully melts the silicon layer.

In the above prior art method, in order to form large silicon grains of uniform sizes, the grain sizes are increased by setting the energy density level in the flat peak region 32 so that the grains at the lower interface of the silicon layer are not fully melted but the rest of the grains are melted, and by increasing the number of laser beam irradiations.

When irradiating a silicon layer, the laser beam must be irradiated repeatedly in an overlapping manner. The number of laser beam irradiations is proportional to the overlapping ratio of the laser beam. It is preferable to reduce the overlapping intervals of the laser beam to increase the sizes of the grains. The overlapping ratio according to the related art amounts to 99 to 98%.

When laser annealing is carried out using the prior art laser profile, the number of laser beam irradiations at a given point is 100 shots when the overlapping ratio is 99%, and 50 shots when the overlapping ratio is 98%. This lengthens the processing time and reduces productivity.

Moreover, the prior art uses a laser energy which leaves the lower interface of the silicon layer intact and melt the rest of the silicon layer. This energy region has a narrow process window. Accordingly, mass-production is difficult and irregular-sized grains are formed when the laser energy varies.

SUMMARY OF THE INVENTION

Accordingly, the present invention is directed to a method of crystallizing a silicon layer that substantially obviates one or more of the problems due to limitations and disadvantages of the related art.

An object of the present invention is to provide a method of forming polycrystalline silicon having large and uniform grains by improving a laser beam profile despite a reduced overlapping ratio, and forming polycrystalline silicon with high quality and productivity.

Another object of the present invention is to provide a method of crystallizing silicon including the steps of melting a silicon layer completely, crystallizing the silicon to form polycrystalline silicon having fine grains by nucleation, melting all the polycrystalline silicon except some portions at a lower interface of the layer, and recrystallizing the silicon layer. This method reduces the number of overlaps of the laser beam and produce large and uniform grains. The first crystallizing step may be replaced by one or two laser beam irradiations to form fine grains.

Additional features and advantages of the invention will be set forth in the description that follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, a method according to the present invention includes the steps of melting a silicon layer completely, forming a polycrystalline silicon layer having fine grains by crystallizing the silicon layer, melting all the polycrystalline layer except a portion of the fine grains at a lower interface of the polycrystalline silicon layer, and solidifying the polycrystalline silicon layer including the unmelted portion.

In another aspect, the present invention includes the step of crystallizing a silicon layer using a laser beam having a profile, wherein the profile includes a first energy density region having a first energy density sufficient to melt the silicon layer completely, a second energy density region having a second energy density sufficient to melt all the silicon layer except a portion lying at a lower interface of the silicon layer, an energy density increasing region (a leading region), and an energy density decreasing region (a trailing region).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiment of the present invention, examples of which are illustrated in the accompanying drawings.

Figure 1:
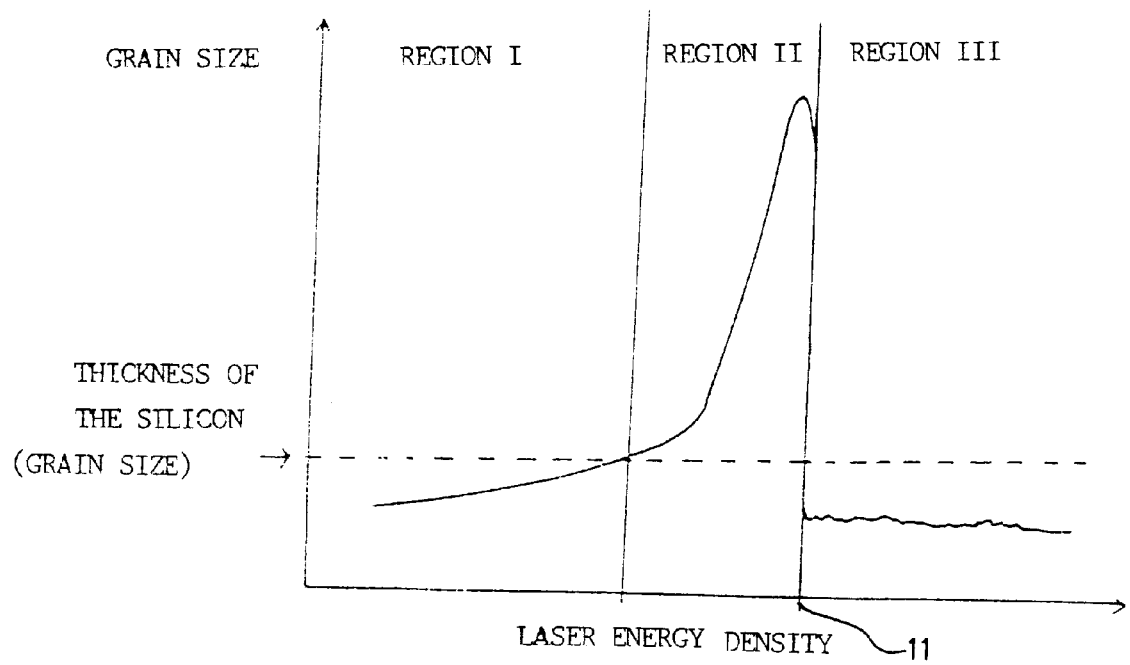
FIG. 1 is a graph showing the relationship between the grain size and the laser energy density in the crystallization of amorphous silicon using a single excimer laser irradiation.
Figure 2:
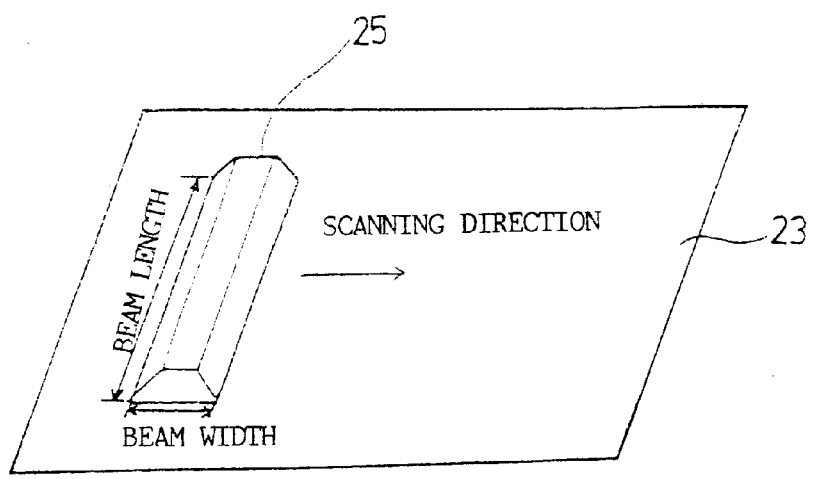
FIG. 2 schematically illustrates a laser beam scanning method.
Figure 3:
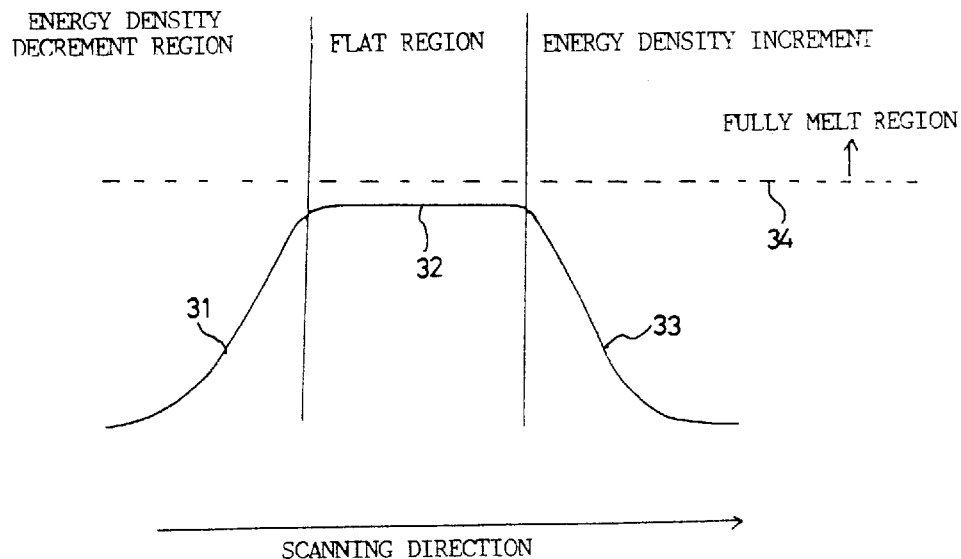
FIG. 3 shows a laser beam profile according to the related art.
Figure 4:
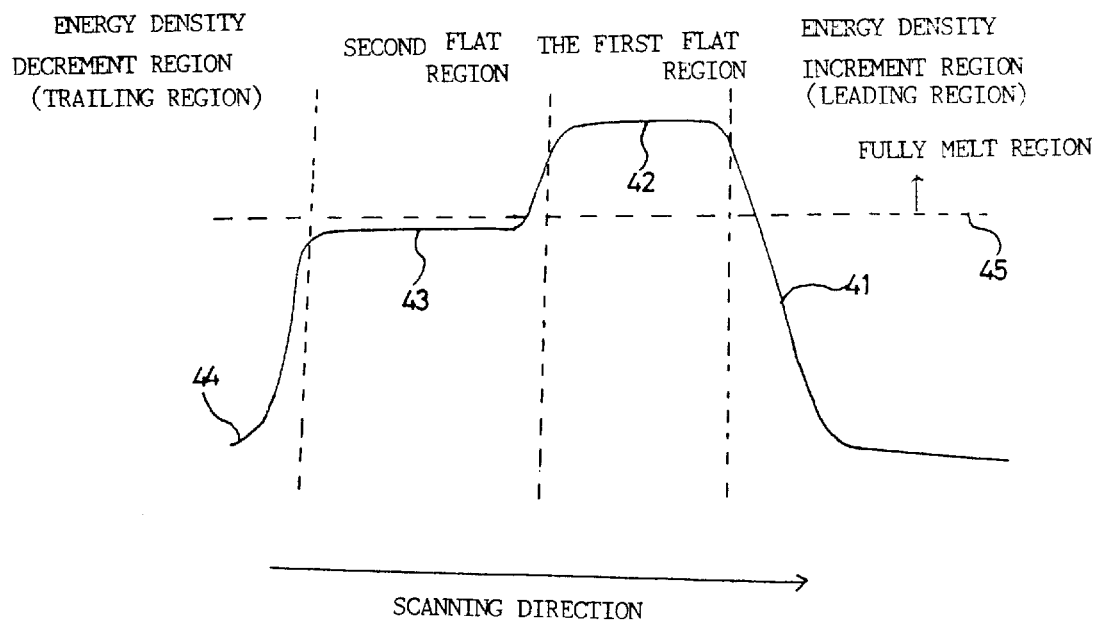
FIG. 4 shows a laser beam profile according to a first embodiment of the present invention.

FIG. 4 shows a laser beam profile for crystallizing an amorphous silicon layer according a first embodiment of the present invention. Referring to FIG. 4, the energy profile of the laser beam has a leading region (energy density increasing region) 41, a first flat region (first energy density region) 42, a second flat region (second energy density region) 43, and a trailing region (energy density decreasing region) 44 spatially arranged from right to left in the above order. The direction of the scan is from left to right. The laser energy density in the first flat region 42 is sufficient to melt the silicon layer completely, while the laser energy density in the second flat region 43 is sufficient to melt the silicon grains in the silicon layer except a portion at a lower interface thereof. The dashed line 45 represents a completely melting point for fully melting the silicon layer.

Accordingly, when an amorphous silicon layer is crystallized by a laser beam preferably having the profile of FIG. 4, the crystallization process includes the steps of melting a first silicon layer completely by a laser shot having an energy level in the first flat region 42, carrying out a first crystallization by solidification, melting all the silicon layer except part of the grains near a lower interface of the silicon layer by a laser shot having an energy level in the second flat region 43, and carrying out a second crystallization by solidification.

An amorphous silicon layer which becomes completely melted in the first crystallization step turns into fine grains. In this case, fine grains may be formed by one or two shots. The crystallized silicon layer having fine grains are recrystallized by a laser shot having an energy in the second flat region 43 which is capable of melting the entire layer except a portion at the lower interface thereof. As a result, large grains of uniform sizes grow.

Accordingly, the present invention enables the formation of large grains of uniform sizes under a reduced overlapping ratio by crystallizing a silicon layer to form fine grains of uniform sizes with the laser energy in the first flat region, and by recrystallizing the fine grains with the laser energy in the second flat region. Large grains of uniform sizes are formed by laser irradiations when a silicon layer is crystallized to grow fine grains of uniformity during the first crystallization and then the crystallized silicon layer is recrystallized by the second crystallization. By using such irradiation method, the number of laser irradiations are also reduced.

Moreover, suitable laser energy density is readily obtained because the process window is wide. Furthermore, the present invention is substantially unaffected by small energy variations in the laser pulses. Thus, the goal of the present invention is achieved despite a reduced overlapping ratio of the laser shots.

Figure 5:
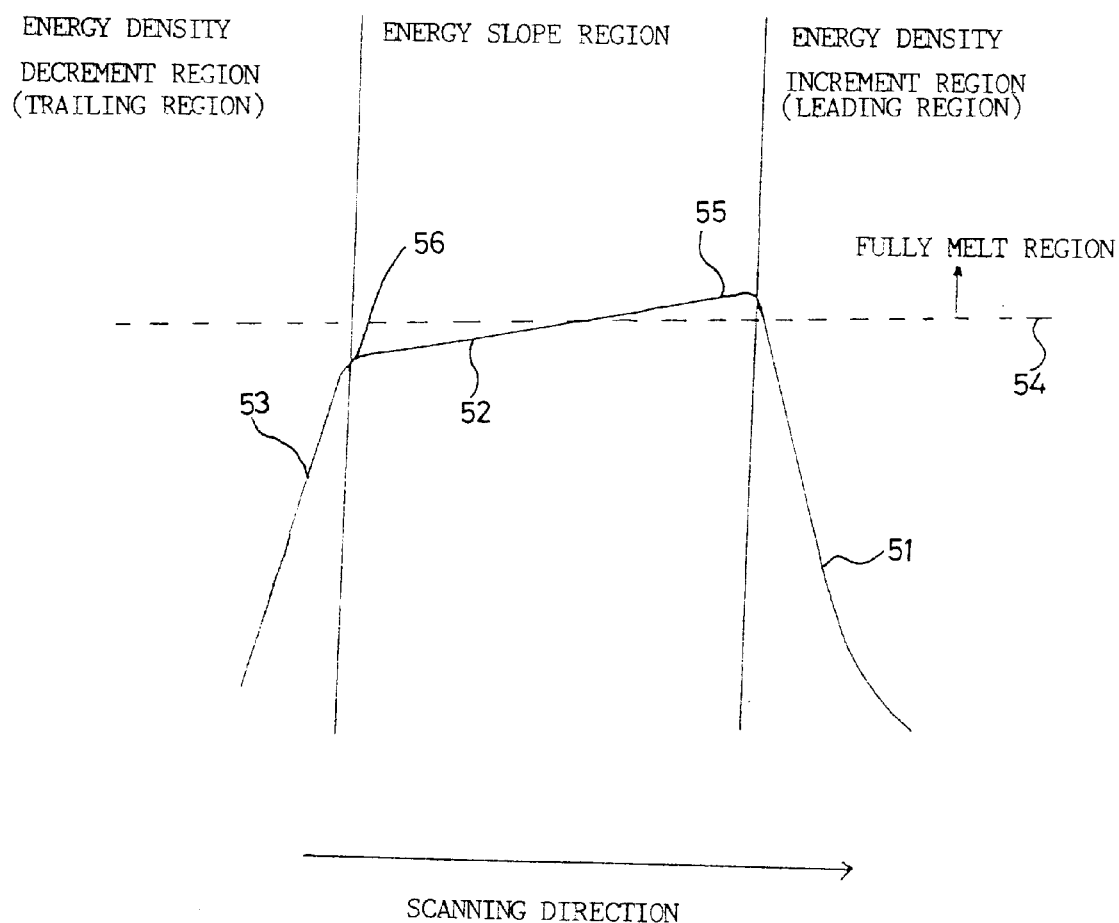
FIG. 5 shows a laser beam profile according to a second embodiment of the present invention.

FIG. 5 shows a laser beam profile for crystallizing an amorphous silicon layer according a second embodiment of the present invention. Referring to FIG. 5, the energy profile of the laser beam has a leading region (energy density increasing region) 51, an energy density sloping region 52 and a trailing region (energy density decreasing region) 53, spatially arranged from right to left in the above order. The dashed line 54 represents a completely melting point for fully melting the silicon layer. The laser energy in the energy density sloping region 52 decreases gradually from a level 55 at the right end of the region 52 which is above the melting level 54, to a level 56 at the left end of the region 52 which is below the melting level 54. At the left end of the region 52, the energy level 56 is sufficient to melt all except a portion of the silicon layer at a lower interface thereof.

Accordingly, the crystallization process carried out by using a laser beam having the energy density profile of FIG. 5 includes the steps of melting an initial amorphous silicon layer completely, carrying out a first crystallization by solidification, melting again all the silicon layer except portions at a lower interface of the layer, and carrying out a second crystallization by solidification. A polycrystalline silicon layer having large grains of uniform sizes is formed by the process including the first crystallization process for forming fine grains followed by the second, re-crystallization process.

The present invention may be applied to a crystallization process which includes the steps of melting an initial silicon layer completely, forming a polycrystalline silicon layer having fine grains by crystallization, melting all the silicon layer but partial grains at a lower interface thereof and recrystallizing the layer by solidification.

The present invention provides a method of forming polycrystalline silicon having large and uniform grains by improving a laser beam profile, enhancing productivity and reducing process time.

Moreover, suitable laser energy density is readily obtained because the process window is wide. Furthermore, the present invention is substantially unaffected by small energy variations in the laser pulses. The goal of the present invention is achieved despite a reduced overlapping ratio of the laser beams.

It will be apparent to those skilled in the art that various modifications and variations can be made in a method of crystallizing a silicon layer of the present invention without departing from the spirit or scope of the inventions. Thus, it is intended that the present invention cover the modifications and variations of this invention provided they come within the scope of the appended claims and equivalents.

What is claimed is:

1. A method of crystallizing an amorphous silicon layer, comprising:
   melting substantially the entire amorphous silicon layer;
   forming a polycrystalline silicon layer having fine grains by crystallizing the melted amorphous silicon layer by irradiating the amorphous silicon layer with a laser beam having an energy profile, wherein the energy profile includes a first energy density region having a first energy density above a complete melting point of the amorphous silicon layer;
   melting all of the polycrystalline layer except a portion of the fine grains formed at a lower interface of the of the polycrystalline layer by irradiating the amorphous silicon layer with a laser beam having an energy profile, wherein the energy profile includes a second energy density region having a second energy density lower than the first energy density; and
   solidifying the polycrystalline layer including the portion so that the fine grains are grown to larger grains.

2. The method of claim 1, wherein the energy profile is arranged so that when the laser beam is scanned, the second energy density region follows the first energy density region.

3. The method of claim 1, wherein the first energy density region has a first flat peak region and second energy density region has a second flat peak region.

4. The method of claim 1, wherein the energy profile is arranged so that when the laser beam is scanned, the second energy density region follows the first energy density region.

5. A method of crystallizing an amorphous silicon layer, comprising:
   scanning a laser beam having an energy profile over the amorphous silicon layer, the energy profile comprising a first energy density region having a first energy density sufficient to melt the amorphous silicon layer completely, thereby forming a polycrystalline silicon layer having fine grains by crystallizing the amorphous silicon layer, and a second energy density region having a second energy density sufficient to melt all the amorphous silicon layer except a portion lying near a lower interface of the silicon layer.

6. The method of claim 5, wherein the energy profile of the laser beam further comprises a leading region and a trailing region.

7. The method of claim 5, wherein when the laser beam is scanned over the silicon layer, any given point on the silicon layer is exposed to the laser beam in the first flat region of the laser beam before it is exposed to the second flat region.

8. The method of claim 5, wherein the first energy density region is a first flat region and the second energy density region is a second flat region.

9. The method of claim 5, wherein the first and second energy density regions form a profile having a gradual slope.

10. A method of crystallizing an amorphous silicon layer, comprising:
    providing the amorphous silicon layer;
    irradiating the amorphous silicon layer with a laser beam having a cross-sectional energy profile, wherein the cross-sectional energy profile includes a first energy density region having a first energy density above a complete melting point of the amorphous silicon layer;
    forming a polycrystalline silicon layer having fine grains by crystallizing the melted amorphous silicon layer;
    melting all of the polycrystalline silicon layer except a portion of the fine grains formed at a lower interface of the polycrystalline silicon layer; and
    solidifying the polycrystalline layer including the portion so that the fine grains are grown to larger grains.

11. The method of claim 10, the cross-sectional energy profile including a leading region, the first energy density region, a second energy density region and a trailing region, wherein the second energy density region has a second energy density below the complete melting point of the polycrystalline silicon layer.

12. The method of claim 11, wherein the cross-sectional energy profile is arranged so that when the laser beam is scanned, the second energy density region follows the first energy density region.

13. The method of claim 11, wherein the first energy density has a first flat peak region and second energy density has a second flat peak region.

14. The method of claim 10, wherein the cross-sectional energy profile has a decreasing slope which includes the first energy density region above the complete melting point of the amorphous silicon layer and a second energy density region having energy density below the complete melting point.

15. The method of claim 14, wherein the cross-sectional energy profile is arranged so that when the laser beam is scanned, the second energy density region follows the first energy density region.

16. A method of crystallizing an amorphous silicon layer, the method comprising the steps of:
    irradiating an amorphous silicon layer at a first energy sufficient to melt substantially the entire amorphous silicon layer such that the amorphous silicon layer is transformed to a small-grained polycrystalline silicon layer; and
    irradiating the small-grained polycrystalline silicon layer at a second energy, the second energy being sufficient to melt a top portion of the small-grained polycrystalline silicon layer, the second energy being insufficient to melt a bottom portion of the small-grained polycrystalline layer;
    wherein the irradiating step at the first energy is performed before the irradiating step at the second energy.

17. The method of claim 16, wherein the irradiating steps are performed by scanning a laser beam over the amorphous silicon layer, the laser beam having a cross-sectional profile including a first portion at the first energy and a second portion at the second energy, the laser beam being scanned in a direction such that the first portion precedes the second portion in the direction.

18. The method of claim 17, wherein the first portion includes a first flat portion and the second portion includes a second flat portion, the first flat portion being above an energy required to melt substantially the entire amorphous silicon layer, the second flat portion being below an energy required to melt substantially the entire polycrystalline silicon layer.

* * * * *